(12) United States Patent
Fukuda et al.

(10) Patent No.: US 8,643,531 B2
(45) Date of Patent: Feb. 4, 2014

(54) ELECTROMAGNETIC WAVE ABSORBER

(75) Inventors: Yuuki Fukuda, Ibaraki (JP); Takashi Wano, Ibaraki (JP); Masataka Tada, Ibaraki (JP); Osamu Hashimoto, Sagamihara (JP)

(73) Assignee: Nitto Denko Corporation, Osaka (JP)

( * ) Notice: Subject to any disclaimer, the term of this patent is extended or adjusted under 35 U.S.C. 154(b) by 487 days.

(21) Appl. No.: 13/093,131

(22) Filed: Apr. 25, 2011

(65) Prior Publication Data
US 2011/0260904 A1 Oct. 27, 2011

(30) Foreign Application Priority Data

Apr. 26, 2010 (JP) ................................. 2010-101268

(51) Int. Cl.
*H01Q 17/00* (2006.01)
(52) U.S. Cl.
USPC .................................................. 342/1; 342/4
(58) Field of Classification Search
USPC ........................................................ 342/1–4
See application file for complete search history.

(56) References Cited

U.S. PATENT DOCUMENTS 3,887,920 A 6/1975 Wright et al.

FOREIGN PATENT DOCUMENTS

| EP | 1049192 | A2 | 11/2000 |
|----|---------|----|---------|
| EP | 1806961 | A1 | 7/2007 |
| JP | 2004-319788 | A | 11/2004 |
| JP | 2004319788 | A * | 11/2004 |
| JP | 2008277363 | A * | 11/2008 |
| WO | 2009031409 | A1 | 3/2009 |
| WO | 2009075322 | A1 | 6/2009 |

OTHER PUBLICATIONS

European Search Report issued in Application No. 11003179.6 dated Nov. 25, 2011.

* cited by examiner

*Primary Examiner* — Timothy A Brainard
(74) *Attorney, Agent, or Firm* — Sughrue Mion, PLLC

(57) ABSTRACT

An electromagnetic wave absorber includes a dielectric layer, a divided conductive film layer and an electromagnetic wave reflective layer, wherein a ratio of thickness 'd' and wavelength 'λ' satisfies a condition of [0.01≤d/λ0.03], weight per unit area of the electromagnetic wave absorber falls within a range of 1000 g/m² and 3000 g/m². The divided conductive film layer is configured such that each side's length of conductive films is dimensioned within a range of 0.5 mm and 4.8 mm and arrangement distance between adjoining conductive films is taken within a range of 0.01 mm and 3 mm.

12 Claims, 11 Drawing Sheets

ELECTROMAGNETIC WAVE ABSORBER

CROSS-REFERENCE TO RELATED APPLICATIONS

This application claims priority from Japanese Patent Application No. 2010-101268, filed on Apr. 26, 2010, the contents of which are hereby incorporated by reference.

BACKGROUND OF THE INVENTION

1. Field of the Invention The present invention relates to an electromagnetic wave absorber that absorbs electromagnetic waves radiated from electronic components such as motor, etc.

2. Description of the Related Art

There have recently seen occasional erroneous operations in electronic components due to electromagnetic disturbances of electronic components such as motor, computer, etc. What is worse, radiation of electromagnetic waves has been known as unfavorable influence upon the human body. To avoid the unfavorable influence of electromagnetic wave radiation, there have been used electromagnetic wave absorbers for absorbing electromagnetic waves. Specifically, electromagnetic wave absorbers have been applied to wall portions surrounding electronic components that radiate electromagnetic waves as well as building walls in order to absorb electromagnetic waves radiated from electronic components.

Incidentally, reduction in film thickness and weight has been required of electromagnetic wave absorbers. For instance, regarding the ETC system (electronic toll collection system) used at toll gates of expressways, employment of electromagnetic wave absorbers have been essential to ceilings and walls of toll gate in order to prevent erroneous operation of an on-vehicle ETC body due to electromagnetic disturbances from adjoining lanes. Therefore, the reduction in film thickness and weight is required of electromagnetic wave absorbers.

As an example of a conventional electromagnetic wave absorber, there has been used a so-called λ/4 type electromagnetic wave absorber of which configuration is designed based on a non-reflecting condition expression that makes electromagnetic waves non-reflective at a surface of the electromagnetic wave absorber.

The λ/4 type electromagnetic wave absorber includes a dielectric layer with a thickness of $\lambda/(4\cdot\sqrt{\in r})$ and a relative permittivity of $\in r$ ($\lambda$ representing wavelength of electromagnetic wave in a vacuum state, $\in r$ representing relative permittivity of the dielectric). One surface of the dielectric layer includes an electromagnetic wave reflective layer and the other surface thereof includes an electrical resistance film layer with an electric-wave impedance of $377\Omega$ in the air. In this connection, the dielectric layer of the λ/4 type electromagnetic wave absorber needs at least the thickness of $\lambda/(4\cdot\sqrt{\in r})$, which restricts degree of reduction in film thickness.

In recent years, there has been proposed an electromagnetic wave absorber of which dielectric layer thickness is made thinner than $\lambda/(4\cdot\sqrt{\in r})$ by inserting a DCF (divided conductive film) between an electrical-resistance film and a reflective layer of a λ/4 type electromagnetic wave absorber (for instance, refer to JP Laid-open Patent Application Publication No. 2004-319788).

However, despite insertion of the DCF (divided conductive film) disclosed in Publication No. 2004-319788, between the electrical resistance film and the reflective layer of the λ/4 type electromagnetic wave absorber, reduction in film thickness and weight for the dielectric layer has not advanced significantly. Further, reduction in film thickness and weight has been required of the DCF as well, in similar with the dielectric layer. However, the reduction in film thickness and weight is not considered for the DCF disclosed in Publication No. 2004-319788.

SUMMARY OF THE INVENTION

The present invention has been made to solve the above described problem and the object thereof is to provide an electromagnetic wave absorber achieving reduction in film thickness and weight for both a dielectric layer and a DFC (divided conductive film) thereof.

In order to achieve the above object, according a first aspect of the present invention, there is provided an electromagnetic wave absorber comprising: a dielectric layer; a divided conductive film layer laminated on one surface of the dielectric layer; and an electromagnetic wave reflective layer laminated on other surface of the dielectric layer, wherein a ratio of 'd', thickness of the electromagnetic wave absorber, and 'λ', wavelength of an electromagnetic wave absorbed by the electromagnetic wave absorber, satisfies a range of: $0.01 \leq d/\lambda \leq 0.03$, and wherein weight per unit area of the electromagnetic wave absorber falls within a range of 1000 g/m$^2$ and 3000 g/m$^2$.

According to the above described electromagnetic wave absorber, the electromagnetic wave absorber employing the DCF can achieve reduction in film thickness and weight for both the dielectric layer and the DCF while exhibiting sufficient electromagnetic wave absorption property. Therefore, the reduction in film thickness and weight can facilitate pasting of the electromagnetic wave absorber on a wall or a ceiling and significantly increase chances of using the electromagnetic wave absorber. Further, the reduction in film thickness for the electromagnetic wave absorber helps lower matching frequency to its lower frequency level. It is to be noted that matching frequency corresponds to frequency of an electromagnetic wave to be absorbed when an electromagnetic wave absorber exhibits its maximum absorption ability.

According to a second aspect of the present invention, there is provided an electromagnetic wave absorber, wherein the divided conductive film layer is constituted by arranging a plurality of quadrilateral conductive films at predetermined distance, wherein each side's length of the quadrilateral conductive films is dimensioned within a range of 0.5 mm and 4.8 mm, and wherein the predetermined distance between adjoining quadrilateral conductive films is within a range of 0.01 mm and 3 mm.

According to the above described electromagnetic wave absorber, each side's length of the conductive films and arrangement distance of adjoining conductive films are properly adjusted as parameters of the DCF. Thereby, reduction in film thickness and weight for both the dielectric layer and DCF can be achieved while sufficient electromagnetic wave absorption property is exhibited.

According to a third aspect of the present invention, there is provided an electromagnetic wave absorber, wherein the dielectric layer is a layer made of thermoplastic resin in which electromagnetic wave absorber material is dispersed.

According to the above described electromagnetic wave absorber, the dielectric layer is a layer made of thermoplastic resin in which electromagnetic wave absorber material is dispersed. Accordingly, effective permittivity of the dielectric layer can be raised. Consequently, the dielectric layer can achieve reduction in film thickness and weight.

According to a fourth aspect of the present invention, there is provided an electromagnetic wave absorber, wherein the dielectric layer is a layer made of thermoplastic material in which flake graphite is dispersed and arrayed vertically with reference to an incident direction of an electromagnetic wave.

According to the above described electromagnetic wave absorber, the dielectric layer is a layer made of thermoplastic material in which flake graphite is dispersed and arrayed vertically with reference to an incident direction of an electromagnetic wave. Accordingly, flat faces of flake graphite can be laid vertically with reference to the incident direction of an electromagnetic wave, which enables the dielectric layer to increase its real part value of the complex relative permittivity without increasing its imaginary part significantly. Consequently, this enables the electromagnetic wave absorber to raise the complex relative permittivity to its higher permittivity level and to meet a non-reflecting state. Thereby, the electromagnetic wave absorber can achieve reduction in film thickness and weight.

According to a fifth aspect of the present invention, there is provided an electromagnetic wave absorber, wherein complex relative permittivity, consisting of a real part and an imaginary part, of the dielectric layer satisfies conditions such that: the real part falls within a range between 10 and 40; and a numerical value portion of the imaginary part falls within a range between 2 and 8, wherein a real part and an imaginary part of all-inclusive complex relative permittivity of the electromagnetic wave absorber inclusive of the dielectric layer and the divided conductive film layer satisfies a non-reflecting condition, and wherein the real part and the imaginary part of the complex relative permittivity of the dielectric layer are respectively smaller than the real part and the imaginary part of the all-inclusive complex relative permittivity.

According to the above described electromagnetic wave absorber, the electromagnetic wave absorber incorporating the DCF and the dielectric layer therein can be designed to meet a non-reflecting condition. Thereby, an electromagnetic wave coming in the electromagnetic wave absorber can be attenuated.

DETAILED DESCRIPTION OF THE PREFERRED EMBODIMENTS

Figure 1:
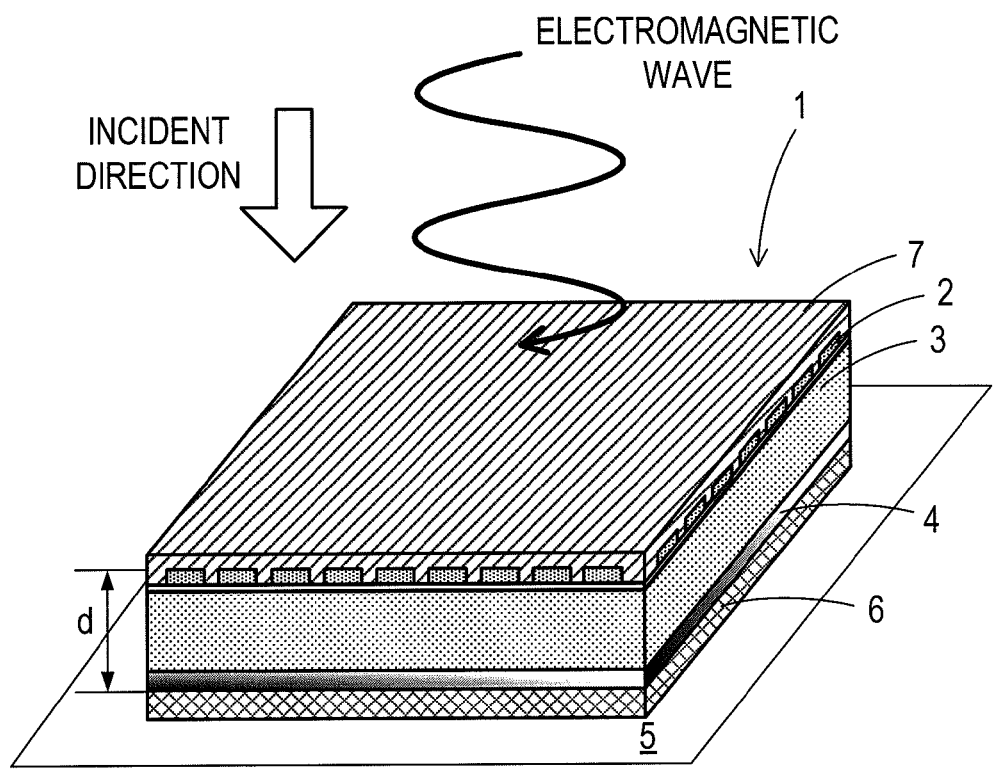
FIG. 1 is an explanatory view of an electromagnetic wave absorber sheet according to the present invention.

Here will be described on exemplary embodiments of electromagnetic wave absorbers of the present invention in detail while referring to the drawings.

First, by referring to FIG. 1, there will be described on configuration of an electromagnetic wave absorber sheet 1 as example of an electromagnetic wave absorber directed to the present invention. FIG. 1 is an explanatory view of an electromagnetic wave absorber sheet according to the present invention.

As shown in FIG. 1, the electromagnetic wave absorber sheet 1 essentially consists of a divided conductive film (abbreviated as DCF, hereinafter) 2, a dielectric layer 3 and an electromagnetic wave reflective layer 4. Specifically, with reference to an incident direction of an electromagnetic wave, the above mentioned constituent layers are laminated in the order of DCF 2, the dielectric layer 3 and the electromagnetic wave reflective layer 4. Further, FIG. 1 shows an exemplary state that the electromagnetic wave absorber sheet 1 is adhered to an adherend 5 such as wall or the like with the aid of an adhesive layer 6. Further, a front side of the DCF 2 is coated with a protective film such as fluorinated polymer film or the like exhibiting excellent weather resistance property and heat resistance property.

Figure 2:
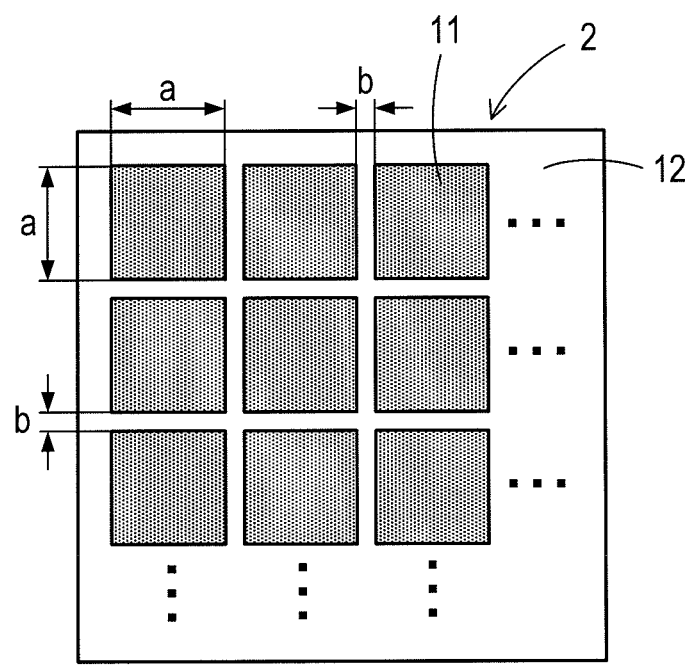
FIG. 2 is a view showing configuration of a DCF formed in the electromagnetic wave absorber sheet according to the present invention.

The DCF 2 has periodic structure where square-shaped conductive films 11 made of conductive material (e.g., copper foil) are arrayed at equal spaces. FIG. 2 exemplarily shows configuration of the DCF 2.

As shown in FIG. 2, the DCF 2 of the present invention is constituted by arranging a plurality of copper foil conductive films 11 on a PI (polyimide) film 12 wherein each side of the conductive films 11 has length 'a' and adjoining conductive films 11 are arranged at equal distance 'b'. Further, it is preferable that 'a', each side's length of the conductive films 11, is dimensioned within a range of 0.5 mm and 4.8 mm and that 'b', arrangement distance of adjoining conductive films 11 is taken within a range of 0.01 mm and 3 mm. By arranging 'a' and 'b' within their respective favorable ranges, the inventive electromagnetic wave absorber can achieve reduction in film thickness and weight, in comparison with the conventional λ/4 type electromagnetic wave absorber.

When an electromagnetic wave vertically comes in the DCF 2, current flows at edge portions of the conductive films 11 and electric fields are collected at gap portions (spaces formed between adjoining conductive films 11). More specifically, a phase delays so as to significantly increase effective permittivity of the electromagnetic wave absorber sheet 1 (also increase a real part and an imaginary part of complex relative permittivity). Accordingly, the electromagnetic wave absorber sheet 1 employing the DCF 2 can achieve reduction in film thickness and weight, in comparison with the conventional λ/4 type electromagnetic wave absorber. Further, the reduction in film thickness enables the electromagnetic wave absorber sheet 1 to lower its matching frequency to lower frequency level.

It is to be noted that material for the conductive films 11 of the DCF 2 is not restricted to copper foil but it may be aluminum, gold, silver, or other electrically conductive film material, etc. The conductive films 11 may be directly mounted on the dielectric layer 3 without intervention of the PI film 12.

The dielectric layer 3 is formed of thermoplastic resin in which electromagnetic wave absorber material is dispersed. As specific examples of thermoplastic resin for the dielectric layer 3, there may be used polymethylmethacrylate resin (PMMA), polyvinyl butyral (PVB), polyethylene (PE), polyethylene terephthalate (PET), etc. The resin material, however, is not particularly restricted to the above examples as long as it is material that can be cast into a film. Further, as specific examples of electromagnetic wave absorber material, there may be used ceramic material, carbonic material, or metallic material, etc. (particularly, barium titanate, ferrite, etc. may be examples of ceramic material; carbon black, graphite, carbon fiber, etc. may be those of carbonic material; and aluminum, nickel, copper, etc. may be those of metallic material; electromagnetic wave absorber material, however, is not restricted to above particular specified material). Meanwhile, as will be described later, in the present invention, anisotropic flake graphite is used as specific electromagnetic wave absorber material. As material of thermoplastic resin to be used for the dielectric layer 3, material adhesive to both the electromagnetic wave reflective layer 4 and the PI film 12 is used.

In the dielectric layer 3 of the present invention, flake graphite is dispersed and arrayed vertically with reference to the incident direction of an electromagnetic wave. Accordingly, flat faces of flake graphite can be laid vertically with reference to the incident direction of an electromagnetic wave, which enables the electromagnetic wave absorber sheet 1 to increase a real part value of its complex relative permittivity without increasing an imaginary part thereof significantly. Consequently, this enables the electromagnetic wave absorber sheet 1 to raise the complex relative permittivity to its higher level and to meet a non-reflecting state. Thereby, the electromagnetic wave absorber sheet 1 can achieve reduction in film thickness and weight.

It is preferable that, in the case of the present invention, the complex relative permittivity of the dielectric layer 3, consisting of a real part and an imaginary part, satisfies conditions such that: the real part falls within a range between 10 and 40; and a numerical value portion of the imaginary part falls within a range between 2 and 8. Further, with reference to an identical value of the real part within the range between 10 and 40, a numerical value part of the imaginary part coupled with the identical value of the real part when satisfying the complex relative permittivity of the dielectric layer 3 is smaller than a numerical value part of the imaginary part coupled with the identical value of the real part when satisfying a non-reflecting condition. That is, a real part and a imaginary part of all-inclusive complex relative permittivity of the electromagnetic wave absorber sheet 1 satisfies a non-reflecting condition, and the real part and the imaginary part of the complex relative permittivity of the dielectric layer 3 are respectively smaller than the real part and the imaginary part of the all-inclusive complex relative permittivity. Specifically, arrangement of the above-described DCF 2 raises the effective permittivity (i.e., raises both a real part and an imaginary part of the complex relative permittivity) of the electromagnetic wave absorber sheet 1. Therefore, it is necessary to previously set the effective permittivity of the dielectric layer 3 of its own at low level (i.e. with respect to the complex relative permittivity of the dielectric layer 3, it is necessary to set both a real part and an imaginary part thereof lower than the real part and the imaginary part thereof that meets a non-reflecting state as single body) so that the electromagnetic wave absorber sheet 1 incorporating the DCF 2 and the dielectric layer 3 therein shall meet the non-reflecting state.

Figure 3:
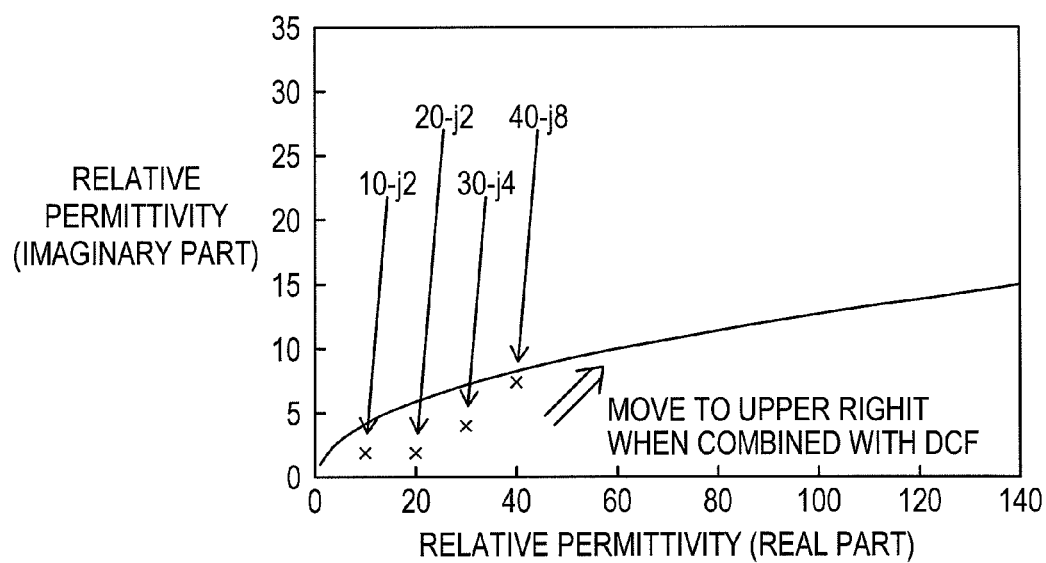
FIG. 3 is a view showing a non-reflecting curve to meet a non-reflecting state and a chart of complex relative permittivity $\in r$ of a dielectric layer used in the present embodiment.

For instance, in the case of the present invention, the complex relative permittivity ∈r is settled as any one of followings: ∈r=10−j2; ∈r=20−j2; ∈r=30−j4; or ∈r=40−j8. FIG. 3 is a view showing a non-reflecting curve to meet a non-reflecting state and a chart of complex relative permittivity ∈r of the dielectric layer 3 used in the present embodiment. As shown in FIG. 3, each of the above settled complex relative permittivity ∈r of the dielectric layer 3 as single body locates under the non-reflecting curve. That is, with reference to an identical value of the real part, a numerical value part of the imaginary part coupled with the identical value of the real part when satisfying the complex relative permittivity of the dielectric layer is smaller than a numerical value part of the imaginary part coupled with the identical value of the real part when satisfying a non-reflecting condition. With respect to the entirety of the electromagnetic wave absorber sheet 1 incorporating the DCF 2 and the dielectric layer 3 therein, each complex relative permittivity ∈r as the entirety thereof moves up and gets on the non-reflecting curve. That is, a real part and a imaginary part of all-inclusive complex relative permittivity of the electromagnetic wave absorber sheet 1 satisfies a non-reflecting condition, and the real part and the imaginary part of the complex relative permittivity of the dielectric layer 3 are respectively smaller than the real part and the imaginary part of the all-inclusive complex relative permittivity.

Meanwhile, the electromagnetic wave reflective layer 4 is a layer serving as reflective means for reflecting an incoming electromagnetic wave. Further, the electromagnetic wave reflective layer 4 is formed from a metallic plate that is made of aluminum, copper, iron, stainless, etc., or from a thin polymer film that is vacuum-sprayed or plated with the above-mentioned metallic material or from a resin film that is reinforced with conductive material such as carbon fiber, etc. The dielectric layer 3 and the electromagnetic wave reflective layer 4 are laminated by direct thermal adhesion or adhesive agent that is weak enough to avoid serious influence on electromagnetic wave absorption characteristics. Further, the lamination order to constitute the electromagnetic wave absorber sheet 1 is designed such that the electromagnetic wave reflective layer 4 is laminated behind the dielectric layer 3 with reference to the incident direction side where an electromagnetic wave comes in. FIG. 1 shows that the incident direction of an electromagnetic wave is in vertical with reference to the electromagnetic wave reflective layer 4, however, the incident direction may not be in vertical with reference to the electromagnetic wave reflective layer 4.

The electromagnetic wave absorber sheet 1 of the present invention may include the adhesive layer 6, if necessary, so as to get the sheet 1 adhered to the adherend 5. The adhesive layer 6 may be made of proper adhesive agent, however, it may be more preferable that the adhesive layer 6 is made of a pressure-sensitive adhesion layer for simple and quick pasting operation. Specifically, proper pressure-sensitive adhesion material may be used for it. Generally, for instance, there may be used organic series, such as: rubber pressure sensitive adhesive; acrylic pressure sensitive adhesive; silicone pressure sensitive adhesive; vinyl alkyl ether pressure sensitive adhesive; polyvinyl alcohol pressure sensitive adhesive; polyvinyl pyrrolidone pressure sensitive adhesive; polyacrylamide pressure sensitive adhesive; cellulose pressure sensitive adhesive, etc.

Further, the adhesive layer 6 may be applied at any proper stages before the final stage of pasting the electromagnetic wave absorber sheet 1 on the adherend 5. Accordingly, the adhesibe layer 6 may be previously applied to the electromagnetic wave absorber sheet 1 in the course of manufacturing thereof or may be applied to the electromagnetic wave absorber sheet 1 as end product.

The adhesive layer 6 may be applied to the electromagnetic wave absorber sheet 1 in accordance with: rolling method such as calendar roll method or the like; sheet formation method such as doctor blade method or gravure roll coater method so as to properly add adhesive material to the electromagnetic wave absorber sheet 1; or method where the adhesive layer 6 formed in accordance with any of the aforementioned methods is adhered to the electromagnetic wave absorber sheet 1 at the one side and covered with a separator at the other side.

Thickness of the adhesive layer 6 may be arbitrarily determined, generally between 1 μm and 500 μm, depending on the intended use. In case the thus arranged adhesive layer 6 is exposed, the exposed side of the adhesive layer 6 may be covered with a separator or the like so to avoid adhesion of dust thereto and the like, if necessary, until getting adhered to the adherend 5.

The protection film 7 is formed of: a film made from fluorinated resin, more specifically, fluorinated polymer; a coated layer; and an impregnation film. Material of fluorinated polymer to be used for making up the protection film 7 is not restricted to particular one but proper material may be used depending on desired characteristics. For instance, there may be used polytetrafluoroethylene, and tetrafluoroethylene-perfluoroalkyl vinyl ether copolymer, tetrafluoroethylene-hexafluoropropylene copolymer, and ethylene-tetrafluoroethylene copolymer, polychlorotrifluoroethylene (PCTFE) and ethylene chlorotrifluoroethylene copolymer (ECTFE), polyvinylidene fluoride (PVDF) and polyvinyl fluoride (PVF). The above-exemplified fluorinated polymer exhibits excellent environmental resistance properties such as ozone resistance, weather resistance, heat resistance, etc. Further, plural kinds of above-exemplified fluorinated polymer may be mixed and used. Further, reinforce base material such as fiber, etc. may be mixed in the protection film 7, as necessary.

Alternatively, the protection film 7 may be formed by mixing fluorinated polymer and non-fluorinated polymer in order to improve physical properties thereof. Mixing balance of non-fluorinated polymer should be 80% by weight or lower of fluorinated polymer or lower, preferably, 50% by weight or lower, or more preferably, 20% by weight or lower in order to maintain weather resistance, etc.

It is preferable that thickness of the protection film 7 is 0.1 μm or thicker in view of intensity, weather resistance, etc. For instance, 20 μm thick may be proper.

It is favorable to use the above-described electromagnetic wave absorber sheet 1 of the present invention as measure against radiation of electromagnetic wave at buildings such as toll gate of ETC (electric toll collecting system), gas station, etc., vehicle safety fences such as guardrail, high-rise buildings, etc. Especially, arrangement of the protection film 7 enhances weather resistance property and rubfastness of the electromagnetic wave absorber sheet. Accordingly, the inventive electromagnetic wave absorber sheet with such protection film is favorably applied to things to be exposed open air when being used.

Further, the electromagnetic wave absorber sheet 1 of the present invention includes the above-described DCF 2. Further, each side's length 'a' of the conductive films 11 and arrangement distance 'b' of adjoining conductive films 11 are properly adjusted as parameters of the DCF 2 so that the reduction in film thickness and weight for the electromagnetic wave absorber sheet 1 can be achieved. In consideration of the case where the electromagnetic wave absorber sheet 1 is pasted on a wall or a ceiling, it is preferable that a ratio of 'd', thickness of the electromagnetic wave absorber sheet 1 incorporating the DCF 2, the dielectric layer 3 and the electromagnetic wave reflective layer 4 therein, and 'λ', wavelength of an electromagnetic wave absorbed by the electromagnetic wave absorber sheet 1, satisfies: $0.01 \leq d/\lambda \leq 0.03$. Further, it is also preferable that weight per unit area of the electromagnetic wave absorber sheet 1 falls within a range of 1000 g/m$^2$ and 3000 g/m$^2$.

Here will be described on the relation of 'a' and 'b' (respectively representing each side's length of the conductive films 11 and arrangement distance of adjoining conductive films 11) and electromagnetic wave absorption characteristics. It is to be noted the conductive films 11 constitutes the DCF 2 used for the electromagnetic wave absorber sheet 1.

In the below described example, with respect to dielectric layer 3 of the electromagnetic wave absorber sheet 1, its complex relative permittivity is set as ($\in$r=9.53−j3.72) and thickness as 4.43 mm. With the above-mentioned fixed settings, change of matching frequency fo and that of electromagnetic wave absorption are measured by changing each side's length 'a' of the conductive films 11 and arrangement distance 'b' of adjoining conductive films 11.

[Relation Between 'a' (Each Side's Length of Conductive Films 11) and Electromagnetic Wave Absorption Characteristics]

Figure 4:
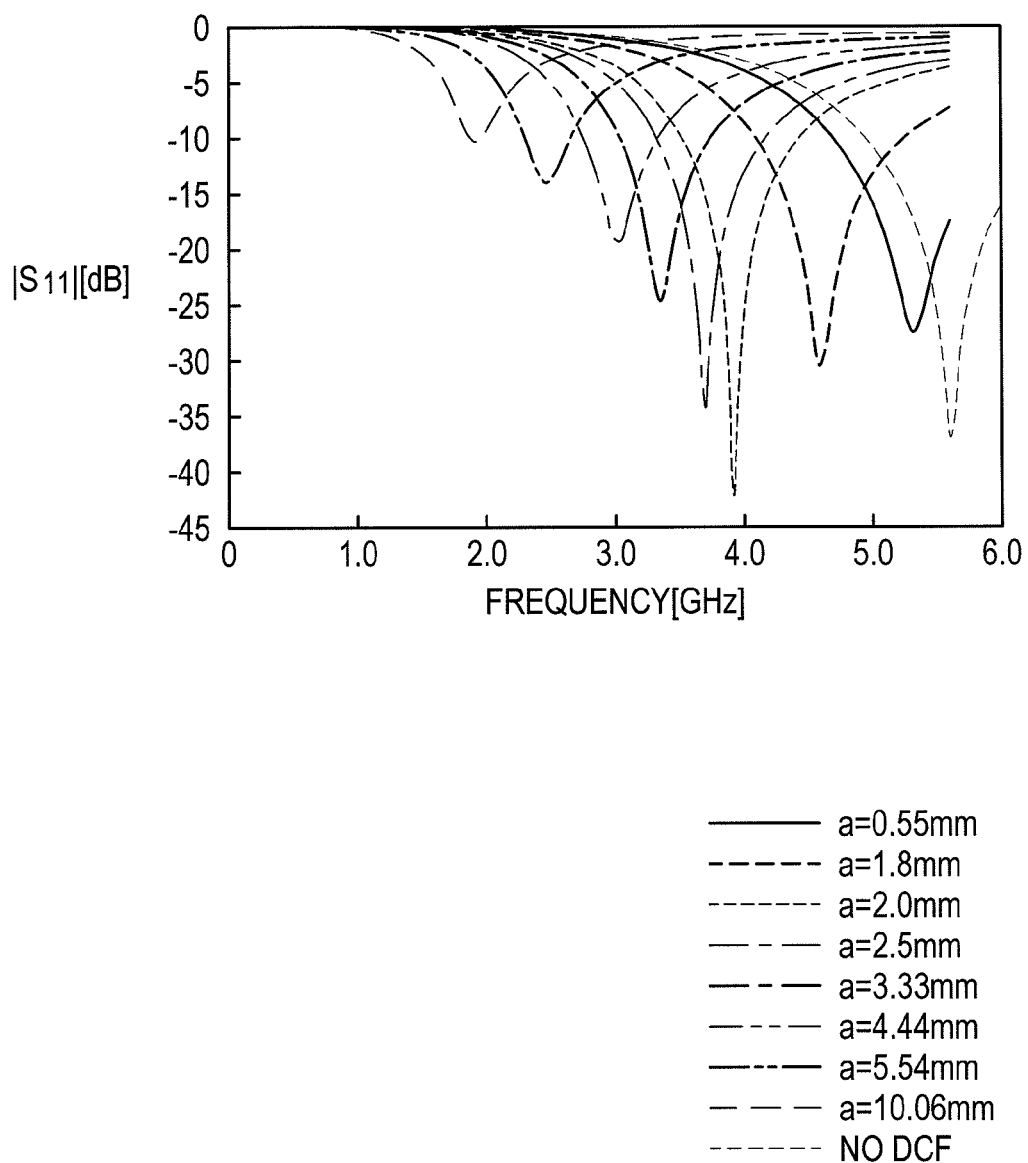
FIG. 4 is a graph showing relation between 'a', each side's length of conductive films of the DCF, and electromagnetic wave absorption characteristics.

The electromagnetic wave absorber sheet 1 subject to measurement is configured as: 4×4 array of the conductive films 11 of the DCF 2; 1 mm of arrangement distance 'b' between adjoining conductive films 11; and 1.0 mm thickness for each conductive film 11. With the above fixed configuration, there has been measured electromagnetic wave absorption obtained by changing each side's length 'a' of the conductive films 11 within a range of 0.55 mm and 10.06 mm. Also, as comparative example thereof, electromagnetic wave absorption obtained when DCF 2 is not employed has been measured. FIG. 4 shows the measurement result. In table 1, there is indicated the relation between matching frequency fo and maximum electromagnetic wave absorption.

TABLE 1

| a [mm] | Max Absorption [dB] | Fo [GHz] |
|---|---|---|
| 0.55 | 27.7 | 5.32 |
| 1.8 | 30.9 | 4.6 |
| 2 | 42.8 | 3.92 |
| 2.5 | 34.5 | 3.7 |
| 3.33 | 24.8 | 3.36 |
| 4.44 | 19.6 | 3.04 |
| 5.54 | 14.1 | 2.48 |
| 10.06 | 10.3 | 1.92 |
| No DCF | 37.3 | 5.6 |

As shown in FIG. 4 and table 1, as the each side's length 'a' is made longer, the matching frequency fo basically lowers to its low frequency level and the maximum electromagnetic wave absorption lowers. When 'a' is set to 2.0 mm, the maximum electromagnetic wave absorption is 42.8 dB, the largest maximum absorption amount.

[Relation Between 'b' (Arrangement Distance of Adjoining Conductive Films 11) and Electromagnetic Wave Absorption Characteristics]

Figure 5:
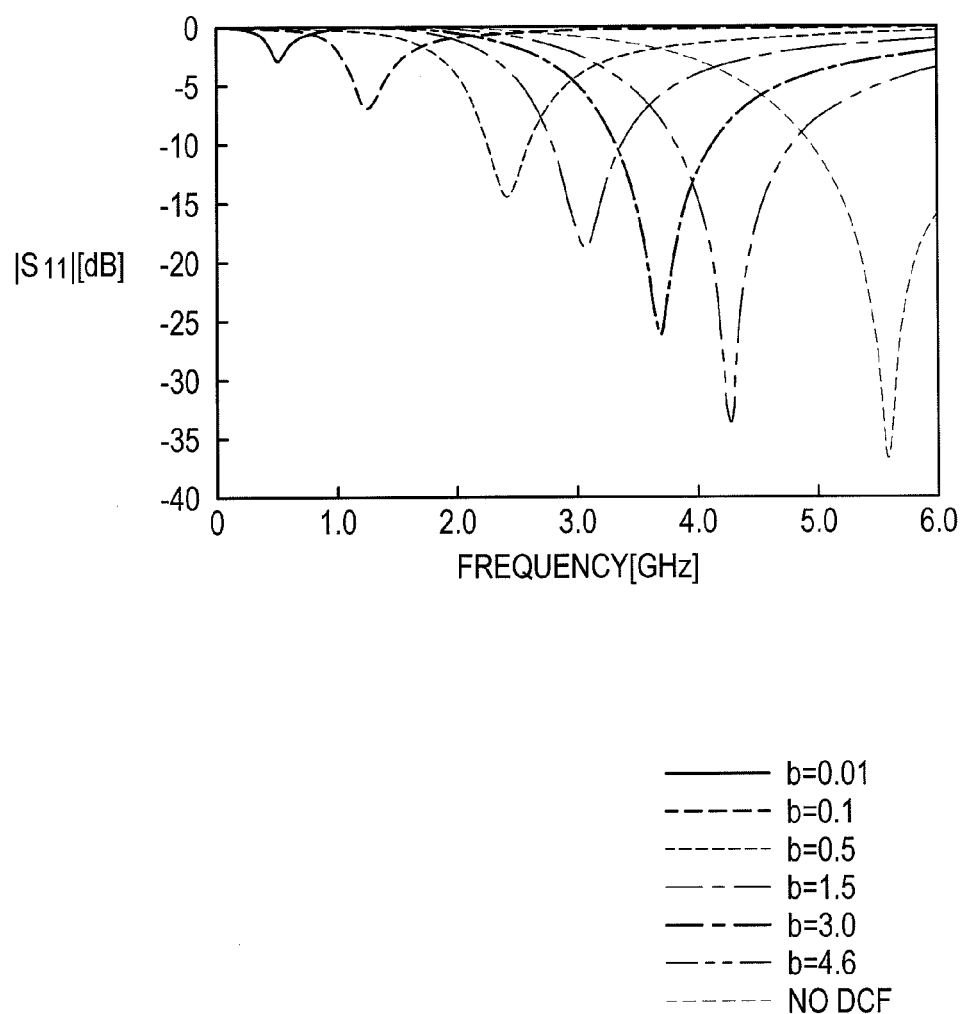
FIG. 5 is a graph showing relation between 'b', arrangement distance of adjoining conductive films of the DCF, and electromagnetic wave absorption characteristics.

Here, the electromagnetic wave absorber sheet 1 subject to measurement is configured as: 4×4 array of the conductive films 11 of the DCF 2; 4.6 mm of 'a' for each side's length of conductive films 11; and 1.0 mm of thickness for each conductive film 11. With the above fixed configuration, there has been measured electromagnetic wave absorption obtained by changing arrangement distance 'b' of adjoining conductive films 11 within a range of 0.01 mm and 4.6 mm. Also, as comparative example thereof, electromagnetic wave absorption obtained when DCF 2 is not employed has been measured. FIG. 5 shows the measurement result. In table 2, there is indicated the relation between matching frequency fo and maximum electromagnetic wave absorption.

TABLE 2

| b [mm] | Max Absorption [dB] | Fo [GHz] |
|---|---|---|
| 0.01 | 2.68 | 0.52 |
| 0.1 | 6.91 | 1.26 |
| 0.5 | 14.4 | 2.42 |
| 1.5 | 18.9 | 3.08 |
| 3 | 26.3 | 3.7 |
| 4.6 | 34 | 4.28 |
| No DCF | 37.3 | 5.6 |

As shown in FIG. 5 and table 2, as arrangement distance 'b' of adjoining conductive films 11 is made shorter, the matching frequency fo basically lowers to its low frequency level and the maximum electromagnetic wave absorption lowers.

[Relation Among 'a' (Each Side's Length of Conductive Films 11), 'b' (Arrangement Distance of Adjoining Conductive Films 11) and Electromagnetic Wave Absorption Characteristics]

Next, four of different arrangement distance 'b' array patterns are prepared with respect to array of the conductive films 11 of the DCF 2. With respect to each of the four array patterns, there have been measured matching frequency fo and maximum electromagnetic wave absorption obtained by changing side's length 'a' of the conductive films 11.

Figure 6:
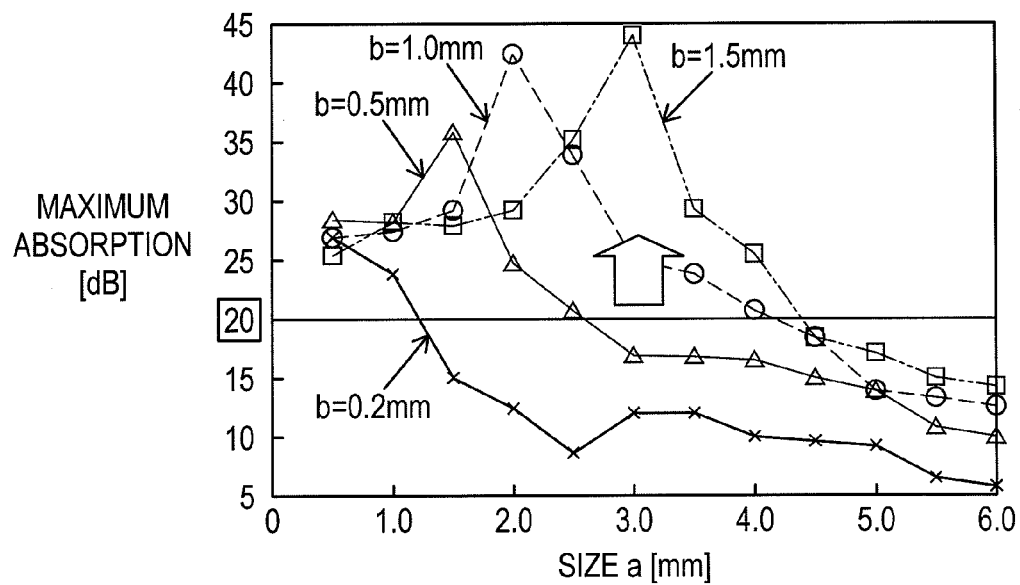
FIG. 6 is a graph showing relation between 'a', each side's length of the conductive films of the DCF, and 'b', arrangement distance of adjoining conductive films.

Here, the electromagnetic wave absorber sheet 1 subject to measurement is configured as: 4×4 array of the conductive films 11 of the DCF 2; and 1.0 mm thickness for each conductive film 11. With the above fixed configuration, arrangement distance 'b' of adjoining conductive films 11 is fixed with the following four different distance of 0.2 mm, 0.5 mm, 1.0 mm and 1.5 mm. With the above four different fixed configuration, there have been measured matching frequency fo and maximum electromagnetic wave absorption obtained by changing each side's length 'a' of the conductive films 11. FIG. 6 shows the measurement result.

As shown in FIG. 6, as the arrangement distance 'b' of adjoining conductive films 11 is made longer, each side's length 'a' of the conductive films 11 when providing maximum electromagnetic wave absorption is longer. With the synergy, maximum electromagnetic wave absorption is larger. The graph of FIG. 6 indicates that 20 dB or larger, sufficient as electromagnetic wave absorption, can be achieved by properly setting the range of each side's length 'a' of the conductive films 11 and that of arrangement distance 'b' of adjoining conductive films 11. For instance, by setting each side's length 'a' of the conductive films 11 to a range of 0.5 mm and 4.8 mm and setting arrangement distance 'b' of adjoining conductive films 11 to a range of 0.01 mm and 3 mm, 20 dB or higher of electromagnetic wave absorption can be achieved.

Figure 7:
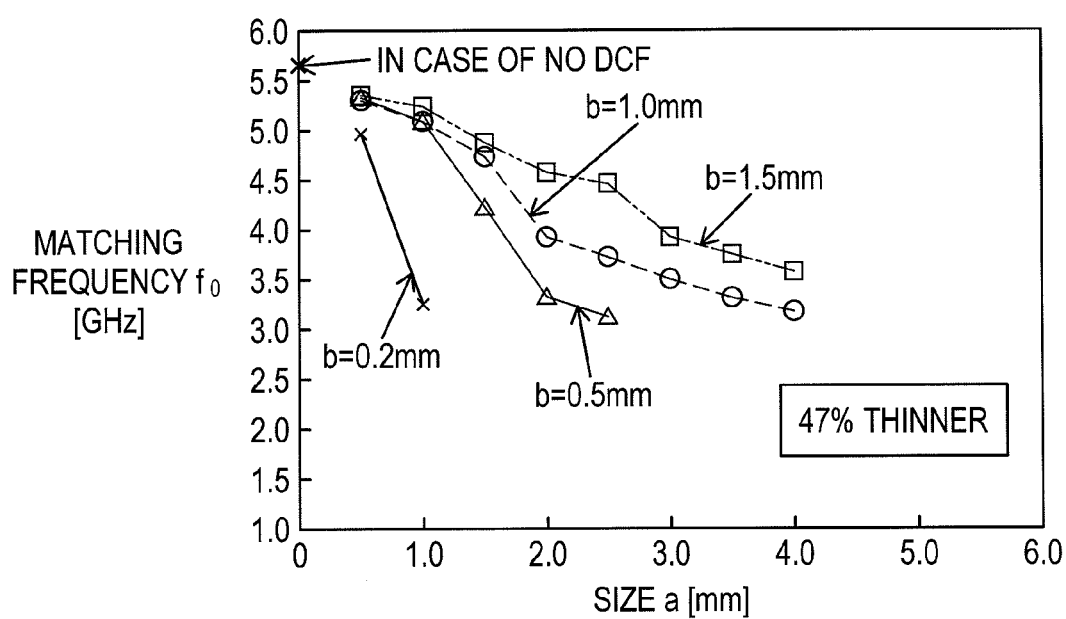
FIG. 7 is a chart showing particular combinations of 'a' and 'b' (respectively representing each side's length of the conductive films and arrangement distance of adjoining conductive films) that achieve 20 dB or larger of electromagnetic wave absorption as well as a measurement result of matching frequency fo.

Out of combinations 'a' and 'b' (respectively representing each side's length of the conductive films and arrangement distance of adjoining conductive films) shown in FIG. 6, the chart shown in FIG. 7 indicates particular combinations of 'a' and 'b' that achieve 20 dB, or larger of electromagnetic wave absorption as well as a measurement result of matching frequency fo.

As shown in FIG. 7, as the arrangement distance 'b' of adjoining conductive films 11 is made shorter, matching frequency fo of each side's length 'a' of the conductive films 11 (when 'a' is fixed) lowers to its lower frequency level.

As the cause of the above phenomenon, binding of electric fields between adjoining conductive films 11 can be pointed out. More specifically, concentration of electrical charges at edge portions of the conductive films 11 makes the DCF 2 work as capacitor. Consequently, the matching frequency fo lowers to its lower frequency level. In other words, because capacity of the capacitor gets larger as the arrangement distance 'b' of adjoining conductive films 11 is made shorter, the matching frequency fo lowers to its lower frequency level as shown in FIG. 7.

The measurement result shown in FIG. 7 indicates that 20 dB of electromagnetic wave absorption and 2.96 GHz of matching frequency can be achieved when the electromagnetic wave absorber sheet 1 subject to measurement employs: the dielectric layers 3 with (∈r=9.53−j3.72) of complex relative permittivity and 4.43 mm thickness; and conductive films 11 with 2.5 mm of each side's length 'a' for the conductive films 11 and 0.5 mm of arrangement distance 'b' between adjoining conductive films 11. On the other hand, in case of an electromagnetic wave absorber that incorporates the DCF 2 from which the above specified dielectric layer 3 is excluded, 8.28 mm of thickness is required of the dielectric layer 3 so as to achieve 2.96 GHz of matching frequency. Accordingly, the measurement result in FIG. 7 indicates that 47% of reduction in film thickness can be achieved when the inventive electromagnetic wave absorber sheet 1 employs the DCF 2 of which parameters 'a' and 'b' (respectively representing each side's length of the conductive films 11 and arrangement distance of adjoining conductive films) are set properly.

Embodiment

Embodiments of the present invention will be described hereinafter.

Firstly, manufacturing process of the electromagnetic wave absorber sheet 1 will be described.

First, dispersion treatment is carried out wherein 100 parts (by weight, similarly indicated hereinafter) of carbon black (BF-5AK manufactured by Chuetsu Graphite Works Co., Ltd.), 1 part of PGM (solvent, manufactured by Taiyou Kagaku Co., Ltd.) and 700 parts of Plysurf A212 (dispersant, manufactured by Dai-ichi Kogyo Seiyaku Co., Ltd.) are dispersed by a bead mill (APEX MILL manufactured by Kotobuki Industries Co., Ltd.). It is to be noted that the dispersion treatment conditions are the use of 6 kilograms of bead, 700 rotations per minute and processing speed of 0.1 hr/kg.

Next, the dispersion liquid obtained at the dispersion treatment is mixed with PMMA solution. The mixing ratio is 901 parts of the dispersion liquid, 500 parts of Delpet SR8500 (PMMA resin manufactured by Asahi Kasei Corporation), 1600 parts of toluol (solvent) and 400 parts of MEK (solvent).

Thus mixed solution is applied to a PET film (75 μm thick). The PET film coated with the mixed solution is dried. It is to be noted that the coating process is carried out under the conditions of 200 μm of coating thickness, 130 degrees in centigrade of drying temperature and 3 minutes of drying time.

Thereafter, sheets formed on the PET film are peeled off therefrom and laminated together. Vacuum thermal press is applied to the laminated sheets (under 100 degrees in centigrade and 15 minutes) by using a spacer previously set to predetermined thickness. Thereby, the electric layer 3 is formed.

Meanwhile, the DCF 2 is formed by arranging a pattern of the copper foil conductive films 11 on the PI film 12 by means of deposition, etching or printing.

The PI film 12 with the conductive films 11 being arranged thereon (i.e., the DCF 2) is pasted on one side of the dielectric layer 3 by means of thermal press. Further, an aluminum foil (the electromagnetic wave reflective layer 4) is adhered to the other side of the dielectric layer 3 by adhesive agent or the like. Further on, 30 μm thickness of an acrylic pressure sensitive adhesive layer formed on a separator is applied to the surface of the aluminum foil, whereby the electromagnetic wave absorber sheet 1 is completed. Additionally, 20 μm thickness of a fluorinated polymer film is pasted on the top surface of the DCF 2 as protection film 7 by means of thermal press.

By carrying out the above described manufacturing processes, four kinds of electromagnetic wave absorber sheets 1 are manufactured. Specifically, the difference of the four kinds of electromagnetic wave absorber sheets 1 lies in different complex relative permittivity ∈r of the dielectric layer 3 employed therein: (first embodiment: ∈r=10−j2); (second embodiment: ∈r=20−j2); (third embodiment: ∈r=30−j4); and (fourth embodiment: ∈r=40−j8). Further, with the four kinds of the dielectric layers 3 difference in complex relative permittivity ∈r, there are further combined varieties of thickness 'd' for the electromagnetic wave absorber sheets 1 and those of conductive films 11 to be arrayed for the DCF 2 made different in each side's length 'a' and arrangement distance 'b' of adjoining conductive films 11. By thus combining various thickness, dielectric layer 3 with various complex relative permittivity ∈r and various patterned conductive films 11, plural electromagnetic wave absorber sheets 1 have been prepared for the respective embodiments.

Evaluation Result of First Embodiment

With respect to each of electromagnetic wave absorber sheets prepared for the first embodiment, maximum electromagnetic wave absorption has been measured.

The below provided table 3 indicates the measurement result of respective electromagnetic wave absorber sheets that have achieved 20 dB or higher of maximum electromagnetic wave absorption by employing the dielectric layer 3 that meets complex relative permittivity ∈r of (∈r=10−j2). Further, FIG. 8 shows the graph corresponding to the table 3.

TABLE 3

| Complex Relative Permittivity: 10 − j2 | | | |
|---|---|---|---|
| d [mm] | a [mm] | b [mm] | Max Absorption [dB] |
| 1.1 | 2.5 | 0.009 | 23 |
|  | 2.7 | 0.012 | 21 |
|  | 2.9 | 0.016 | 20 |
| 1.2 | 2 | 0.005 | 21 |
|  | 2.5 | 0.012 | 25 |
|  | 2.7 | 0.017 | 24 |
|  | 3 | 0.025 | 23 |
|  | 3.2 | 0.035 | 28 |
|  | 3.5 | 0.05 | 23 |
|  | 3.7 | 0.065 | 25 |
|  | 3.9 | 0.085 | 21 |
| 1.3 | 2 | 0.007 | 25 |
|  | 2.5 | 0.016 | 32 |
|  | 3 | 0.035 | 27 |
|  | 3.2 | 0.05 | 22 |
|  | 3.5 | 0.07 | 24 |
|  | 3.7 | 0.09 | 23 |
|  | 4 | 0.12 | 20 |
|  | 4.2 | 0.17 | 22 |
|  | 4.5 | 0.22 | 22 |
|  | 4.7 | 0.28 | 20 |
|  | 5 | 0.35 | 21 |
|  | 5.2 | 0.42 | 20 |
|  | 5.4 | 0.5 | 20 |
| 1.4 | 2 | 0.01 | 22 |
|  | 3 | 0.05 | 31 |
|  | 3.5 | 0.09 | 29 |
|  | 3.7 | 0.12 | 29 |
|  | 4 | 0.15 | 21 |
|  | 4.2 | 0.2 | 24 |
|  | 4.5 | 0.27 | 24 |
|  | 4.7 | 0.32 | 24 |
|  | 5 | 0.4 | 20 |
|  | 5.2 | 0.5 | 21 |
|  | 5.4 | 0.6 | 21 |
|  | 5.6 | 0.7 | 20 |
|  | 5.8 | 0.85 | 20 |
|  | 6 | 1.08 | 20 |

Figure 8:
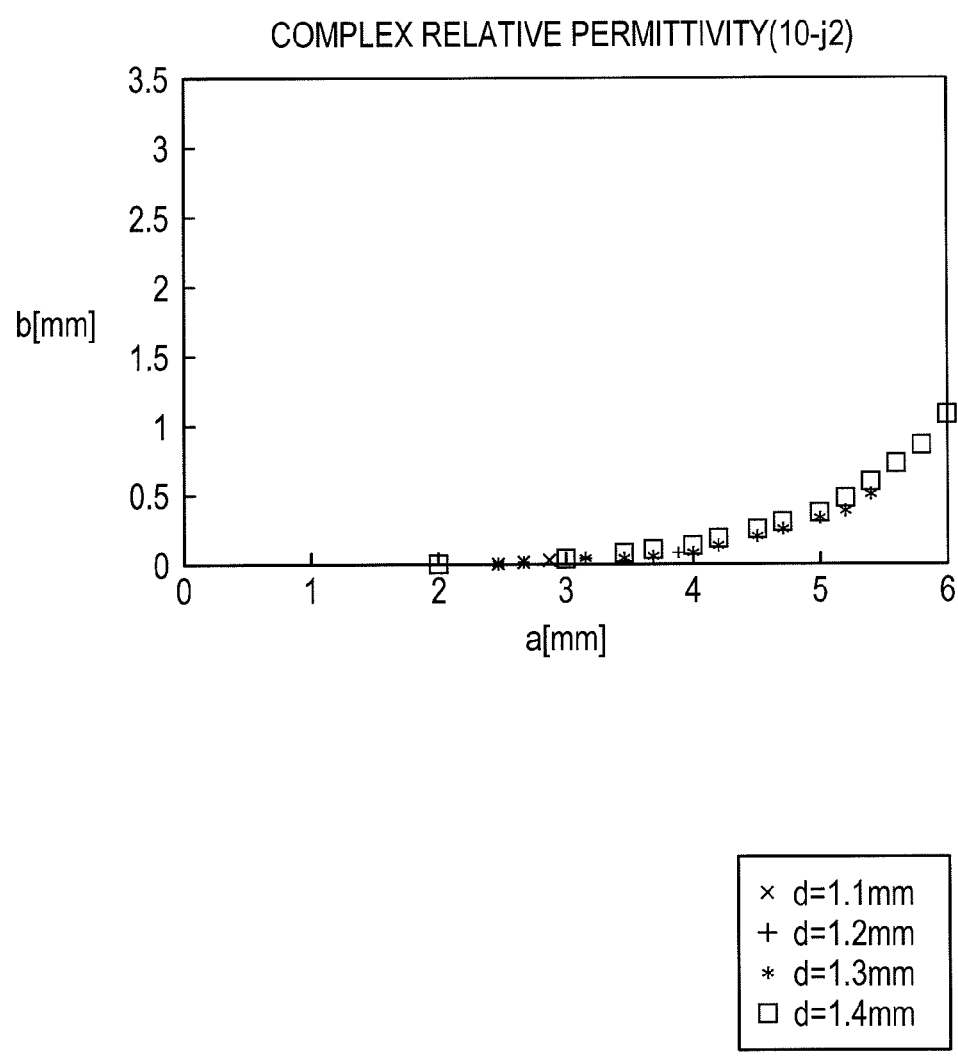
FIG. 8 is a chart showing particular combinations of 'a' and 'b' (respectively representing each side's length of the conductive films and arrangement distance of adjoining conductive films) that achieve 20 dB or larger of maximum electromagnetic wave absorption when using an electromagnetic wave absorber sheet employing a dielectric layer of which complex relative permittivity $\in r$ meets $\in r=10-j2$.

The measurement result shown in table 3 and FIG. 8 indicates combinations of 'a' and 'b' (respectively representing each side's length of conductive films 11 and arrangement distance of adjoining conductive films 11) to achieve 20 dB or higher of maximum electromagnetic wave absorption when the electromagnetic wave absorber sheet 1 that employs the dielectric layer 3 meeting complex relative permittivity ∈r of (∈r=10−j2) is configured to have thickness 'd' of 1.1 mm, 1.2 mm, 1.3 mm or 1.4 mm. Especially, combinations of (d=1.2 mm, a=3.2 mm, b=0.035 mm), (d=1.3 mm, a=2.5 mm~3.0 mm, b=0.016 mm~0.035 mm) and (d=1.4 mm, a=3.0 mm~3.7 mm, b=0.056 mm~0.12 mm) have achieved high maximum electromagnetic wave absorption.

Evaluation Result of Second Embodiment

Figure 9:
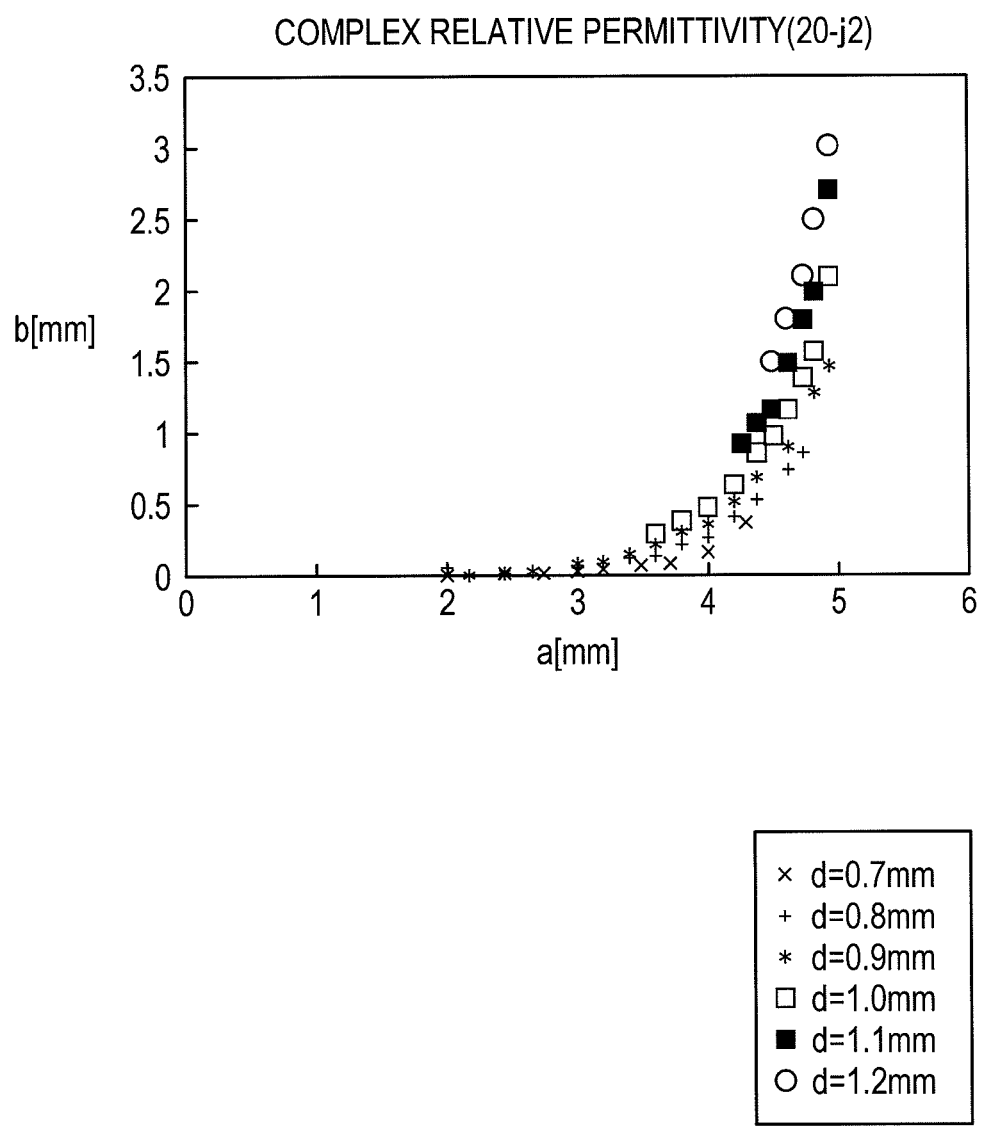
FIG. 9 is a chart showing particular combinations of 'a' and 'b' (respectively representing each side's length of the conductive films and arrangement distance of adjoining conductive films) that achieve 20 dB or larger of maximum electromagnetic wave absorption when using an electromagnetic wave absorber sheet employing a dielectric layer of which complex relative permittivity $\in r$ meets $\in r=20-j2$.

The below provided table 4 indicates the measurement result of respective electromagnetic wave absorber sheets that have achieved 20 dB or higher of maximum electromagnetic wave absorption by employing the dielectric layer 3 that meets complex relative permittivity ∈r of (∈r=20−j2). Further, FIG. 9 shows the graph corresponding to the table 4.

TABLE 4

Complex Relative Permittivity: 20 − j2

| d [mm] | a [mm] | b [mm] | Max Absorption [dB] |
|---|---|---|---|
| 0.7 | 2 | 0.005 | 24 |
| | 2.5 | 0.013 | 22 |
| | 2.8 | 0.025 | 25 |
| | 3 | 0.035 | 23 |
| | 3.2 | 0.05 | 22 |
| | 3.5 | 0.09 | 22 |
| | 3.7 | 0.11 | 22 |
| | 4 | 0.18 | 22 |
| | 4.3 | 0.3 | 20 |
| 0.8 | 2 | 0.085 | 24 |
| | 2.5 | 0.025 | 20 |
| | 3 | 0.06 | 37 |
| | 3.2 | 0.08 | 31 |
| | 3.4 | 0.12 | 23 |
| | 3.6 | 0.15 | 26 |
| | 3.8 | 0.2 | 25 |
| | 4 | 0.28 | 32 |
| | 4.2 | 0.35 | 22 |
| | 4.4 | 0.5 | 23 |
| | 4.6 | 0.7 | 21 |
| | 4.7 | 0.82 | 20 |
| 0.9 | 2.2 | 0.021 | 21 |
| | 2.5 | 0.04 | 20 |
| | 2.7 | 0.055 | 22 |
| | 3 | 0.1 | 20 |
| | 3.2 | 0.13 | 24 |
| | 3.4 | 0.17 | 24 |
| | 3.6 | 0.22 | 25 |
| | 3.8 | 0.3 | 26 |
| | 4 | 0.38 | 29 |
| | 4.2 | 0.5 | 31 |
| | 4.4 | 0.7 | 20 |
| | 4.6 | 0.9 | 25 |
| | 4.8 | 1.3 | 21 |
| | 4.9 | 1.5 | 20 |
| 1 | 3.6 | 0.31 | 20 |
| | 3.8 | 0.4 | 21 |
| | 4 | 0.5 | 21 |
| | 4.2 | 0.65 | 23 |
| | 4.4 | 0.9 | 23 |
| | 4.5 | 1 | 24 |
| | 4.6 | 1.2 | 26 |
| | 4.7 | 1.4 | 24 |
| | 4.8 | 1.6 | 26 |
| | 4.9 | 2.1 | 21 |
| 1.1 | 4.3 | 0.95 | 20 |
| | 4.4 | 1.1 | 21 |
| | 4.5 | 1.2 | 22 |
| | 4.6 | 1.5 | 22 |
| | 4.7 | 1.8 | 22 |
| | 4.8 | 2 | 33 |
| | 4.9 | 2.7 | 21 |
| 1.2 | 4.5 | 1.5 | 20 |
| | 4.6 | 1.8 | 21 |
| | 4.7 | 2.1 | 24 |
| | 4.8 | 2.5 | 36 |
| | 4.9 | 3 | 21 |

The measurement result shown in table 4 and FIG. 9 indicates that combinations of 'a' and 'b' (respectively representing each side's length of conductive films 11 and arrangement distance of adjoining conductive films 11) to achieve 20 dB or higher of maximum electromagnetic wave absorption when the electromagnetic wave absorber sheet 1 that employs the dielectric layer 3 meeting complex relative permittivity ∈r of (∈r=20−j2) is configured to have thickness 'd' of 0.7 mm, 0.8 mm, 0.9 mm, 1.0 mm, 1.1 mm or 1.2 mm. Especially, combinations of (d=0.8 mm, a=3.0 mm~3.2 mm, b=0.06 mm~0.08 mm), (d=0.8 mm, a=3.8 mm~4.0 mm, b=0.2 mm~0.28 mm), (d=0.9 mm, a=4.0 mm~4.2 mm, b=0.38 mm~0.50 mm), (d=1.1 mm, a=4.7 mm~4.8 mm, b=1.8 mm~2.0 mm) and (d=1.2 mm, a=4.8 mm, b=2.5 mm) have achieved high maximum electromagnetic wave absorption.

Evaluation Result of Third Embodiment

Figure 10:
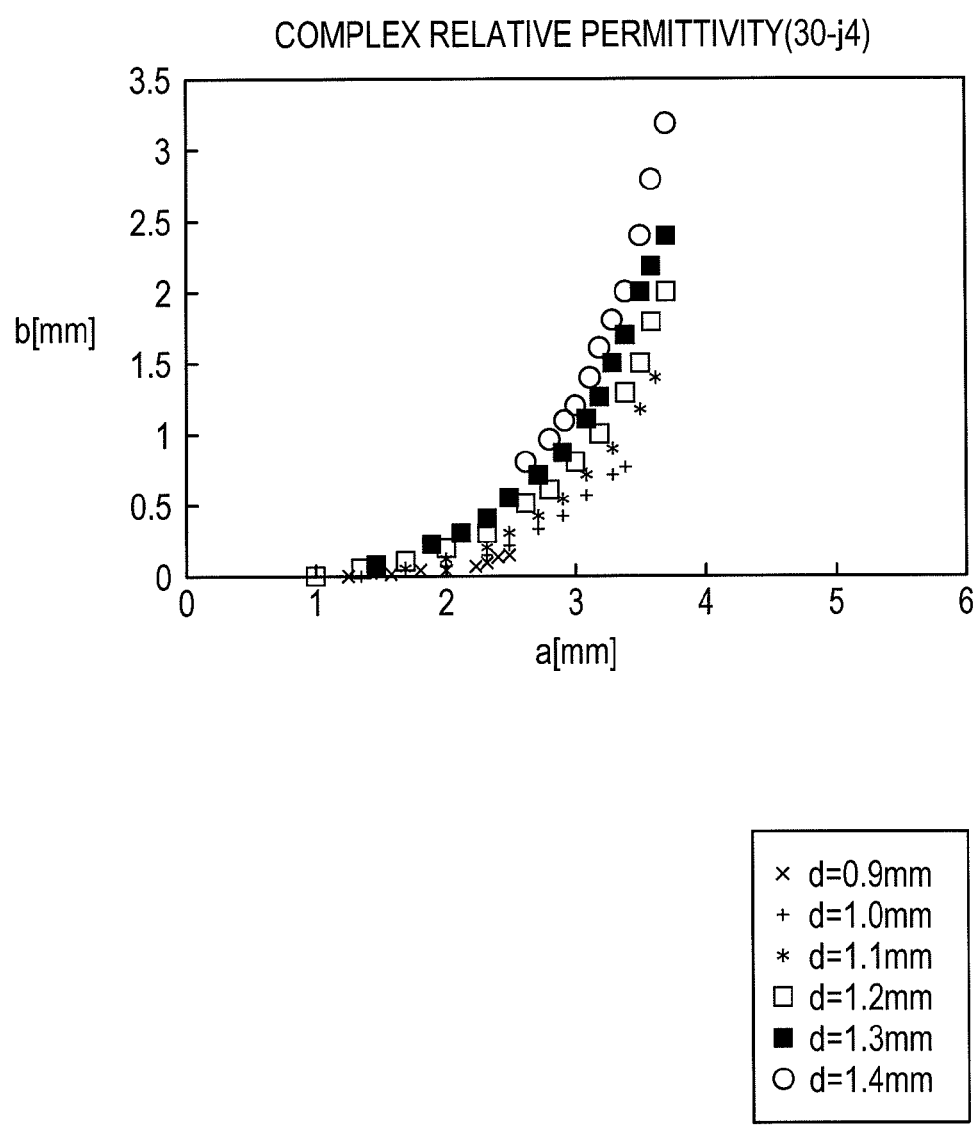
FIG. 10 is a chart showing particular combinations of 'a' and 'b' (respectively representing each side's length of the conductive films and arrangement distance of adjoining conductive films) that achieve 20 dB or larger of maximum electromagnetic wave absorption when using an electromagnetic wave absorber sheet employing a dielectric layer of which complex relative permittivity $\in r$ meets $\in r=30-j4$.

The below provided table 5 indicates the measurement result of respective electromagnetic wave absorber sheets that have achieved 20 dB or higher of maximum electromagnetic wave absorption by employing the dielectric layer 3 that meets complex relative permittivity ∈r of (∈r=30−j4). Further, FIG. 10 shows the graph corresponding to the table 5.

TABLE 5

Complex Relative Permittivity: 30 − j4

| d [mm] | a [mm] | b [mm] | Max Absorption [dB] |
|---|---|---|---|
| 0.9 | 1 | 0.003 | 22 |
| | 1.3 | 0.01 | 20 |
| | 1.6 | 0.025 | 21 |
| | 1.8 | 0.04 | 21 |
| | 2 | 0.065 | 22 |
| | 2.2 | 0.09 | 21 |
| | 2.3 | 0.115 | 21 |
| | 2.4 | 0.135 | 20 |
| | 2.5 | 0.16 | 20 |
| 1 | 1 | 0.005 | 25 |
| | 1.4 | 0.02 | 26 |
| | 1.7 | 0.045 | 26 |
| | 2 | 0.09 | 26 |
| | 2.3 | 0.15 | 21 |
| | 2.5 | 0.22 | 26 |
| | 2.7 | 0.3 | 26 |
| | 2.9 | 0.4 | 24 |
| | 3.1 | 0.55 | 21 |
| | 3.3 | 0.7 | 21 |
| | 3.4 | 0.75 | 21 |
| 1.1 | 1 | 0.008 | 23 |
| | 1.5 | 0.04 | 22 |
| | 1.7 | 0.07 | 27 |
| | 2 | 0.13 | 23 |
| | 2.3 | 0.225 | 35 |
| | 2.5 | 0.3 | 27 |
| | 2.7 | 0.4 | 32 |
| | 2.9 | 0.55 | 26 |
| | 3.1 | 0.7 | 30 |
| | 3.3 | 0.9 | 27 |
| | 3.5 | 1.15 | 22 |
| | 3.6 | 1.4 | 20 |
| 1.2 | 1 | 0.012 | 22 |
| | 1.4 | 0.05 | 23 |
| | 1.7 | 0.1 | 23 |
| | 2 | 0.2 | 23 |
| | 2.3 | 0.3 | 25 |
| | 2.6 | 0.5 | 20 |
| | 2.8 | 0.6 | 29 |
| | 3 | 0.8 | 32 |
| | 3.2 | 1 | 41 |
| | 3.4 | 1.3 | 31 |
| | 3.5 | 1.5 | 26 |
| | 3.6 | 1.8 | 20 |
| | 3.7 | 2 | 20 |
| 1.3 | 1.5 | 0.09 | 20 |
| | 1.9 | 0.21 | 20 |
| | 2.1 | 0.3 | 21 |
| | 2.3 | 0.4 | 21 |
| | 2.5 | 0.55 | 22 |
| | 2.7 | 0.7 | 23 |
| | 2.9 | 0.85 | 23 |
| | 3.1 | 1.1 | 27 |
| | 3.2 | 1.25 | 31 |
| | 3.3 | 1.5 | 23 |
| | 3.4 | 1.7 | 23 |
| | 3.5 | 2 | 20 |
| | 3.6 | 2.2 | 24 |
| | 3.7 | 2.4 | 20 |
| 1.4 | 2.6 | 0.77 | 20 |
| | 2.8 | 0.95 | 20 |

TABLE 5-continued

| Complex Relative Permittivity: 30 − j4 | | | |
|---|---|---|---|
| d [mm] | a [mm] | b [mm] | Max Absorption [dB] |
| | 2.9 | 1.1 | 22 |
| | 3 | 1.2 | 21 |
| | 3.1 | 1.4 | 24 |
| | 3.2 | 1.6 | 24 |
| | 3.3 | 1.8 | 26 |
| | 3.4 | 2 | 34 |
| | 3.5 | 2.4 | 25 |
| | 3.6 | 2.8 | 23 |
| | 3.7 | 3.2 | 21 |

The measurement result shown in table 5 and FIG. 10 indicates combinations of 'a' and 'b' (respectively representing each side's length of conductive films 11 and arrangement distance of adjoining conductive films 11) to achieve 20 dB or higher of maximum electromagnetic wave absorption when the electromagnetic wave absorber sheet 1 that employs the dielectric layer 3 meeting complex relative permittivity ∈r of (∈r=30−j4) is configured to have thickness 'd' of 0.9 mm, 1.0 mm, 1.1 mm and 1.2 mm, 1.3 mm and 1.4 mm. Especially, combinations of (d=1.1 mm, a=2.3 mm~2.7 mm, b=0.225 mm~0.4 mm), (d=1.2 mm, a=2.8 mm~3.4 mm, b=0.6 mm~1.3 mm), (d=1.3 mm, a=3.1 mm~3.2 mm, b=1.1 mm~1.25 mm) and (d=1.4 mm, a=3.4 mm, b=2 mm) have achieved high maximum electromagnetic wave absorption.

Evaluation Result of Fourth Embodiment

The below provided table 6 indicates the measurement result of respective electromagnetic wave absorber sheet that have achieved 20 dB or higher of maximum electromagnetic wave absorption by employing the dielectric layer 3 that meets complex relative permittivity ∈r of (∈r=40−j8). Further, FIG. 11 shows the graph corresponding to the table 6.

TABLE 6

| Complex Relative Permittivity: 40 − j8 | | | |
|---|---|---|---|
| d [mm] | a [mm] | b [mm] | Max Absorption [dB] |
| 1.4 | 0.4 | 0.004 | 22 |
| | 0.6 | 0.017 | 20 |
| | 0.8 | 0.005 | 21 |
| | 1 | 0.11 | 21 |
| | 1.2 | 0.2 | 20 |
| | 1.5 | 0.37 | 20 |
| | 1.7 | 0.52 | 20 |

Figure 11:
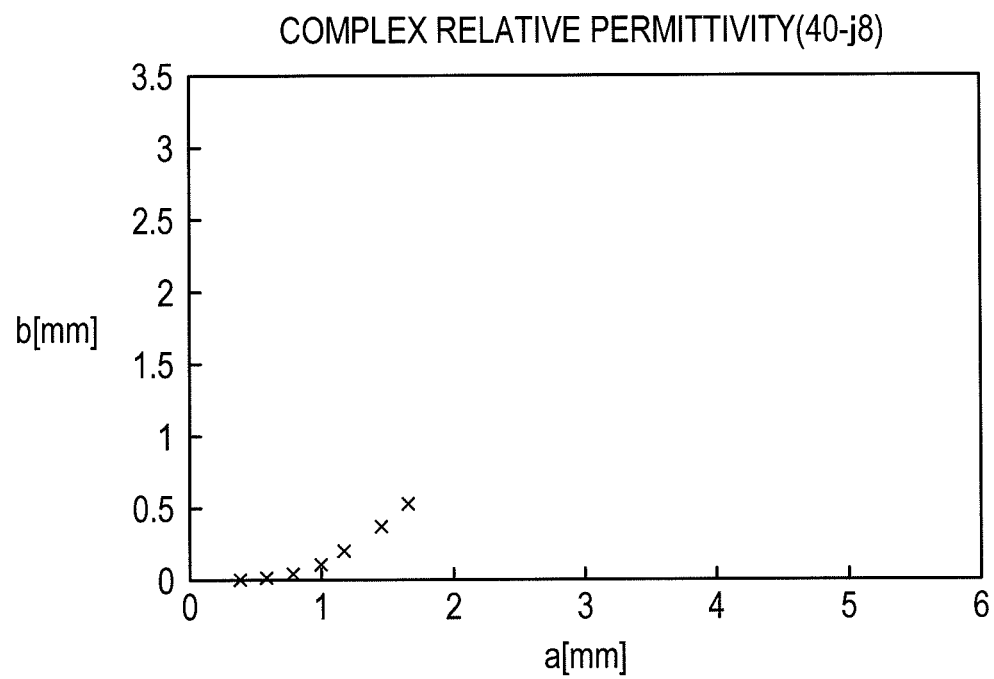
FIG. 11 is a chart showing particular combinations of 'a' and 'b' (respectively representing each side's length of the conductive films and arrangement distance of adjoining conductive films) that achieve 20 dB or larger of maximum electromagnetic wave absorption when using an electromagnetic wave absorber sheet employing a dielectric layer of which complex relative permittivity $\in r$ meets $\in r=40-j8$.

The measurement result shown in table 6 and FIG. 11 indicates that combinations of 'a' and 'b' (respectively representing each side's length of conductive films 11 and arrangement distance of adjoining conductive films 11) to achieve 20 dB or higher of maximum electromagnetic wave absorption when the electromagnetic wave absorber sheet 1 that employs the dielectric layer 3 meeting complex relative permittivity ∈r of (∈r=40−j8) is configured to have thickness 'd' of 1.4 mm.

The evaluations results of the first through fourth embodiments indicate that sufficient electromagnetic wave absorption (e.g., 20 dB or higher) can be achieved by setting each side's length 'a' of the conductive films 11 and arrangement distance 'b' of adjoining conductive films 11 to a range of 0.5 mm and 4.8 mm and a range of 0.01 mm and 3 mm, respectively even though the electromagnetic wave absorber sheet 1 has thickness within a range of 0.517 mm and 1.55 mm.

As described in the above, the electromagnetic wave absorber sheet 1 of the present invention includes the DCF 2, the dielectric layer 3 and the electromagnetic wave reflective layer 4. In the inventive electromagnetic wave absorber sheet 1, a ratio of 'd', thickness of the electromagnetic wave absorber sheet 1, and 'λ', wavelength of an electromagnetic wave absorbed by the electromagnetic wave absorber sheet 1, satisfies a range of: $0.01 \leq d/\lambda \leq 0.03$, and weight per unit area of the electromagnetic wave absorber sheet 1 falls within a range of 1000 g/m$^2$ and 3000 g/m$^2$. Accordingly, the electromagnetic wave absorber sheet 1 employing the DCF 2 can achieve the reduction in film thickness and weight for both the dielectric layer 3 and the DCF 2 while exhibiting sufficient electromagnetic wave absorption property. Therefore, the reduction in film thickness and weight can facilitate pasting of the electromagnetic wave absorber sheet 1 on a wall and a ceiling and significantly increase chances of using the electromagnetic wave absorber sheet 1. Further, the reduction in film thickness for the electromagnetic wave absorber sheet 1 helps lower matching frequency to its lower frequency level.

Further, the DCF 2 is constituted by arranging a plurality of conductive films 11 at predetermined distance, wherein each side's length of the conductive films 11 is dimensioned within a range of 0.5 mm and 4.8 mm and the predetermined distance between adjoining conductive films 11 is within a range of 0.01 mm and 3 mm. Accordingly, the electromagnetic wave absorber sheet 1 employing the DCF 2 can achieve reduction in film thickness and weight for both the dielectric layer 3 and the DCF 2 while exhibiting sufficient electromagnetic wave absorption property.

Further, the dielectric layer 3 is a layer made of thermoplastic material in which flake graphite is dispersed and arrayed vertically with reference to an incident direction of an electromagnetic wave. Accordingly, flat faces of flake graphite can be laid vertically with reference to the incident direction of an electromagnetic wave, which enables the dielectric layer 3 to increase a real part value of its complex relative permittivity without increasing an imaginary part significantly. Consequently, this enables the electromagnetic wave absorber sheet 1 to raise the complex relative permittivity to its higher level and to meet a non-reflecting state. Thereby, the electromagnetic wave absorber sheet 1 can achieve reduction in film thickness and weight.

Further, complex relative permittivity, consisting of a real part and an imaginary part, of the dielectric layer 3 satisfies conditions such that: the real part falls within a range between 10 and 40; and a numerical value portion of the imaginary part falls within a range between 2 and 8. Further, a real part and an imaginary part of all-inclusive complex relative permittivity of the electromagnetic wave absorber sheet 1 inclusive of the dielectric layer 3 and the DCF 2 satisfies a non-reflecting condition and the real part and the imaginary part of the complex relative permittivity of the dielectric layer 3 are respectively smaller than the real part and the imaginary part of the all-inclusive complex relative permittivity. Accordingly, the electromagnetic wave absorber sheet 1 incorporating the DCF 2 and the dielectric layer 3 therein can be designed to meet non-reflecting condition. Thereby, an electromagnetic wave coming in the electromagnetic wave absorber sheet 1 can be attenuated.

Not to mention, the present invention is not limited to the above-described embodiment but may be variously improved and modified without departing from the scope of the present invention.

The conductive films 11 mounted on the DCF 2 are shaped into square, however, they may be shaped into other forms (e.g., rectangular).

Flake graphite is used as electromagnetic wave absorber material to be dispersed in the dielectric layer 3 in the present embodiment, however, other carbonic material, metallic material, ceramic material may be used.

What is claimed is:

1. An electromagnetic wave absorber comprising:
   a dielectric layer;
   a divided conductive film layer laminated on one surface of the dielectric layer; and
   an electromagnetic wave reflective layer laminated on other surface of the dielectric layer,
   wherein a ratio of 'd', thickness of the electromagnetic wave absorber, and 'λ', wavelength of an electromagnetic wave absorbed by the electromagnetic wave absorber, satisfies a range of: $0.01 \leq d/\lambda \leq 0.03$, and
   wherein weight per unit area of the electromagnetic wave absorber falls within a range of 1000 g/m$^2$ and 3000 g/m$^2$.

2. The electromagnetic wave absorber according to claim 1,
   wherein the divided conductive film layer is constituted by arranging a plurality of quadrilateral conductive films at predetermined distance,
   wherein each side's length of the quadrilateral conductive films is dimensioned within a range of 0.5 mm and 4.8 mm, and
   wherein the predetermined distance between adjoining quadrilateral conductive films is within a range of 0.01 mm and 3 mm.

3. The electromagnetic wave absorber according to claim 2,
   wherein the dielectric layer is a layer made of thermoplastic resin in which electromagnetic wave absorber material is dispersed.

4. The electromagnetic wave absorber according to claim 3,
   wherein the dielectric layer is a layer made of thermoplastic material in which flake graphite is dispersed and arrayed vertically with reference to an incident direction of an electromagnetic wave.

5. The electromagnetic wave absorber according to claim 4,
   wherein complex relative permittivity, consisting of a real part and an imaginary part, of the dielectric layer satisfies conditions such that:
   the real part falls within a range between 10 and 40; and
   a numerical value portion of the imaginary part falls within a range between 2 and 8,
   wherein a real part and an imaginary part of all-inclusive complex relative permittivity of the electromagnetic wave absorber inclusive of the dielectric layer and the divided conductive film layer satisfies a non-reflecting condition, and
   wherein the real part and the imaginary part of the complex relative permittivity of the dielectric layer are respectively smaller than the real part and the imaginary part of the all-inclusive complex relative permittivity.

6. The electromagnetic wave absorber according to claim 3,
   wherein complex relative permittivity, consisting of a real part and an imaginary part, of the dielectric layer satisfies conditions such that:
   the real part falls within a range between 10 and 40; and
   a numerical value portion of the imaginary part falls within a range between 2 and 8,
   wherein a real part and an imaginary part of all-inclusive complex relative permittivity of the electromagnetic wave absorber inclusive of the dielectric layer and the divided conductive film layer satisfies a non-reflecting condition, and
   wherein the real part and the imaginary part of the complex relative permittivity of the dielectric layer are respectively smaller than the real part and the imaginary part of the all-inclusive complex relative permittivity.

7. The electromagnetic wave absorber according to claim 2,
   wherein complex relative permittivity, consisting of a real part and an imaginary part, of the dielectric layer satisfies conditions such that:
   the real part falls within a range between 10 and 40; and
   a numerical value portion of the imaginary part falls within a range between 2 and 8,
   wherein a real part and an imaginary part of all-inclusive complex relative permittivity of the electromagnetic wave absorber inclusive of the dielectric layer and the divided conductive film layer satisfies a non-reflecting condition, and
   wherein the real part and the imaginary part of the complex relative permittivity of the dielectric layer are respectively smaller than the real part and the imaginary part of the all-inclusive complex relative permittivity.

8. The electromagnetic wave absorber according to claim 1,
   wherein the dielectric layer is a layer made of thermoplastic resin in which electromagnetic wave absorber material is dispersed.

9. The electromagnetic wave absorber according to claim 8,
   wherein the dielectric layer is a layer made of thermoplastic material in which flake graphite is dispersed and arrayed vertically with reference to an incident direction of an electromagnetic wave.

10. The electromagnetic wave absorber according to claim 9,
    wherein complex relative permittivity, consisting of a real part and an imaginary part, of the dielectric layer satisfies conditions such that:
    the real part falls within a range between 10 and 40; and
    a numerical value portion of the imaginary part falls within a range between 2 and 8,
    wherein a real part and an imaginary part of all-inclusive complex relative permittivity of the electromagnetic wave absorber inclusive of the dielectric layer and the divided conductive film layer satisfies a non-reflecting condition, and
    wherein the real part and the imaginary part of the complex relative permittivity of the dielectric layer are respectively smaller than the real part and the imaginary part of the all-inclusive complex relative permittivity.

11. The electromagnetic wave absorber according to claim 8,
    wherein complex relative permittivity, consisting of a real part and an imaginary part, of the dielectric layer satisfies conditions such that:
    the real part falls within a range between 10 and 40; and
    a numerical value portion of the imaginary part falls within a range between 2 and 8,
    wherein a real part and an imaginary part of all-inclusive complex relative permittivity of the electromagnetic wave absorber inclusive of the dielectric layer and the divided conductive film layer satisfies a non-reflecting condition, and
    wherein the real part and the imaginary part of the complex relative permittivity of the dielectric layer are respectively smaller than the real part and the imaginary part of the all-inclusive complex relative permittivity.

12. The electromagnetic wave absorber according to claim 1,
wherein complex relative permittivity, consisting of a real part and an imaginary part, of the dielectric layer satisfies conditions such that:
the real part falls within a range between 10 and 40; and
a numerical value portion of the imaginary part falls within a range between 2 and 8,
wherein a real part and an imaginary part of all-inclusive complex relative permittivity of the electromagnetic wave absorber inclusive of the dielectric layer and the divided conductive film layer satisfies a non-reflecting condition, and
wherein the real part and the imaginary part of the complex relative permittivity of the dielectric layer are respectively smaller than the real part and the imaginary part of the all-inclusive complex relative permittivity.

* * * * *